US007402863B2

(12) United States Patent
Jones

(10) Patent No.: US 7,402,863 B2
(45) Date of Patent: Jul. 22, 2008

(54) TRENCH FET WITH REDUCED MESA WIDTH AND SOURCE CONTACT INSIDE ACTIVE TRENCH

(75) Inventor: David P. Jones, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/157,371

(22) Filed: Jun. 21, 2005

(65) Prior Publication Data

US 2005/0280079 A1 Dec. 22, 2005

Related U.S. Application Data

(60) Provisional application No. 60/581,666, filed on Jun. 21, 2004.

(51) Int. Cl.
*H01L 29/72* (2006.01)
(52) U.S. Cl. .................. 257/331; 257/332; 257/401; 257/413; 257/754; 257/773
(58) Field of Classification Search .............. 257/330, 257/331, 332, 401, 413, 754, 773
See application file for complete search history.

(56) References Cited

U.S. PATENT DOCUMENTS

| 5,945,701 | A | 8/1999 | Siergiej et al. ............. 257/285 |
| 6,291,310 | B1 | 9/2001 | Madson et al. ............. 438/424 |
| 6,413,822 | B2 | 7/2002 | Williams et al. ........... 438/270 |
| 6,545,316 | B1 | 4/2003 | Baliga ....................... 257/329 |
| 6,781,194 | B2 | 8/2004 | Baliga ....................... 257/327 |
| 6,784,486 | B2 | 8/2004 | Baliga ....................... 257/327 |
| 6,791,143 | B2 * | 9/2004 | Baliga ....................... 257/328 |
| 2004/0026737 | A1 * | 2/2004 | Zundel et al. ............. 257/330 |
| 2004/0104427 | A1 * | 6/2004 | Hao et al. .................. 257/330 |

OTHER PUBLICATIONS

Davide Chiola et al., "Increased Efficiency and Improved Reliability in "ORing" Functions using Trench Schottky Technology," 6 pages, as presented at PCIM Europe, 2002.

* cited by examiner

*Primary Examiner*—Edward Wojciechowicz
(74) *Attorney, Agent, or Firm*—Ostrolenk, Faber, Gerb & Soffen, LLP

(57) ABSTRACT

A trench FET has source contacts which contact the entire top surface of source regions, and contact a portion of side walls of the source regions. The side walls of the source regions form a portion of the side walls of the trenches in the trench FET.

3 Claims, 2 Drawing Sheets

TRENCH FET WITH REDUCED MESA WIDTH AND SOURCE CONTACT INSIDE ACTIVE TRENCH

CROSS-REFERENCE TO RELATED APPLICATION

This application claims the benefit of U.S. Provisional Application No. 60/581,666, filed on Jun. 21, 2004, the entirety of the contents of which is hereby incorporated by reference herein.

BACKGROUND OF THE INVENTION

1. Field of the Invention

This invention relates to trench-type MOSFETs and more specifically to a structure and process for shrinking the mesa width in a trench device.

2. Description of the Related Art

Referring to FIG. 1, a typical trench type, vertical conduction power MOSFET 10 includes a plurality of trenches 12 formed in semiconductor body 14. Semiconductor body 14 is usually a silicon die that includes an epitaxially grown silicon layer (epitaxial silicon layer) 16 of one conductivity (e.g. N-type in FIG. 1) formed over a silicon substrate 18 of the same conductivity, the epitaxial silicon layer 16 having a lower concentration of impurities than the silicon substrate 18. A channel region 20 (sometimes referred to as body region) is formed in epitaxial silicon layer 16 and extends from the top surface of the semiconductor body to a first depth. Channel region 20 has a conductivity opposite to that of epitaxial layer 16 (e.g. P-type in FIG. 1). Formed within channel region 20 are source regions 22, which have the same conductivity (e.g. N-type in FIG. 1) as epitaxial silicon layer 16.

As is well known, trenches 12 extend to a depth below the depth of channel region 20 and include gate insulation 24, which may be formed of silicon dioxide, on at least the sidewalls of trenches 12. The bottom of each trench 12 is also insulated with silicon dioxide or the like and a gate electrode 26 is disposed within each trench 12. Gate electrodes 26 may be composed of conductive polysilicon. As is illustrated in FIG. 1, gate electrodes 26 are recessed to a position below the top of the trenches and, thus, below the top surface of the semiconductor body.

A typical trench type power MOSFET further includes a source electrode 28, which is electrically connected to source regions 22, and a high conductivity contact region 30, which is also formed in channel region 20. High conductivity contact region 30 is highly doped with dopants of the same conductivity as channel region 20 (e.g. P-type in FIG. 1) in order to reduce the contact resistance between source contact 28 and channel region 20. In addition, dielectric caps 32, which conveniently may be made of tetraethylorthosilicate (TEOS) insulation, electrically isolate the gate electrodes 26 from the source electrode 28. A typical trench type power MOSFET 10 further includes a drain electrode 33 in electrical contact with silicon substrate 18.

It is well known that the density of the current that a power MOSFET may carry is directly proportional to the number of formed channels per unit area. One way of increasing the number of such formed channels is to reduce the spacing between or pitch of the trenches. Reduction in pitch of the trenches is, however, limited by the minimum width of the mesa, which is the top surface of the die between adjacent trenches, shown as 34 on FIG. 1. The minimum width of the mesa is defined by source regions 22 and high conductivity regions 30 and the source contact area, namely, the contact area between the source electrode 28 and the source region 22.

BRIEF SUMMARY OF THE INVENTION

In accordance with the present invention, the source region is contacted at least partly inside the active trench. A silicide contact may be used, which wraps over the top of each mesa and then down and along a portion of the side walls of the mesa. In this way, the mesa width can be reduced to only a few hundred angstroms while providing a substantial connection area between the source contact and the source region.

The novel structure of the invention will make possible trench devices with cell pitches of less than 1 µm.

DETAILED DESCRIPTION OF THE INVENTION

Figure 1:
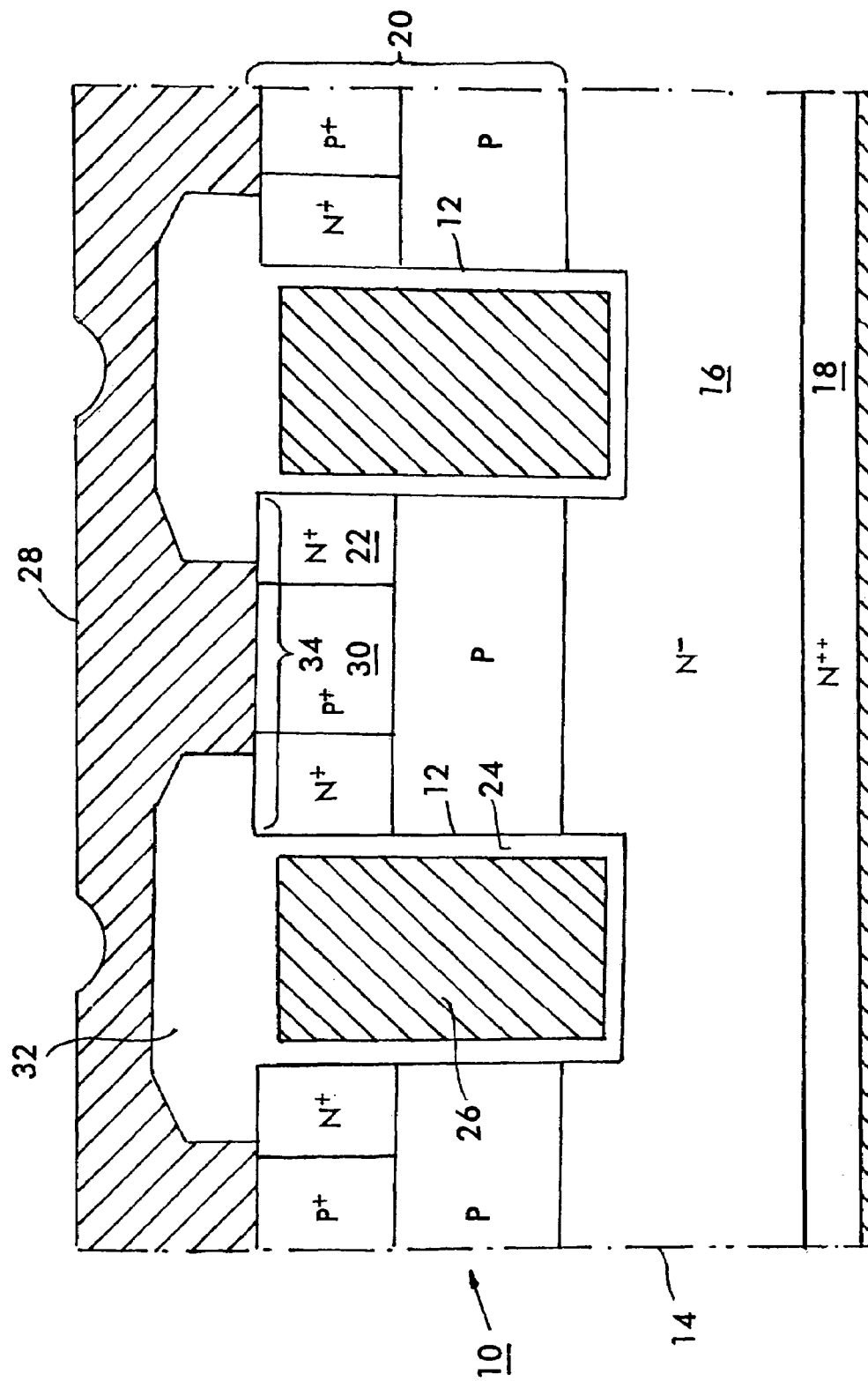
FIG. 1 is a cross-sectional view of a portion of a conventional trench-type MOSFET.
Figure 2:
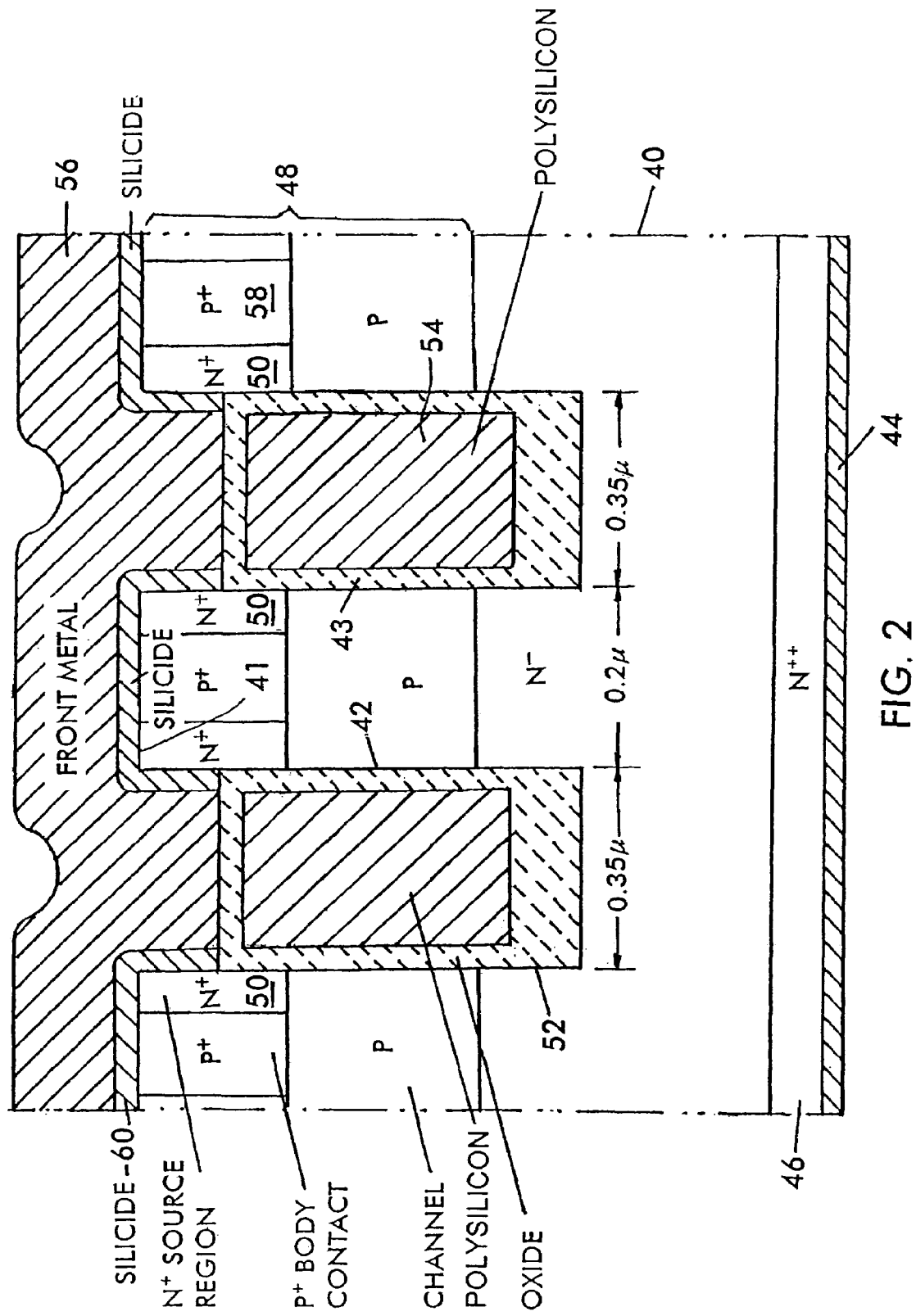
FIG. 2 is a cross-sectional view of a portion of the trench-type MOSFET of the invention.

FIG. 2 is a cross-section of two adjacent trenches 42 and 43 in a wafer or die 40 containing a large number of such trenches in its active area. As in a conventional trench-type MOSFET, (see FIG. 1), a drain electrode 44 is formed on the bottom of silicon substrate 46 and an epitaxial silicon layer 40 of one conductivity (e.g. N-type in FIG. 2) is formed on top of silicon substrate 46, the epitaxial silicon layer 40 having a lower concentration of impurities than the silicon substrate 46. The channel region 48 is formed in epitaxial silicon layer 40. Channel region 48 has a conductivity opposite to that of epitaxial silicon layer 40 (e.g. P-type in FIG. 2). Source regions 50 are formed within channel region 48, source regions 50 having the same conductivity (e.g. N-type in FIG. 2) as epitaxial silicon layer 40.

In addition, as in a conventional trench-type MOSFET, trenches 42 and 43 extend below the depth of channel region 48 and include gate insulation 52 on the sidewalls and bottom of each trench. Gate electrodes 54, preferably composed of conductive polysilicon, are disposed in trenches 42 and 43, and gate insulation 52 is placed on top of the gate electrodes 54. In accordance with one aspect of the invention, the top surface of the gate insulation 52 is 0.3 to 0.4 µm below the tops of trenches 42 and 43. The gate insulation 52, on top of the gate electrodes 54, electrically isolates the gate electrodes 54 from the source electrode 56, the trench-type MOSFET of the invention having no extending dielectric cap, as in a conventional trench-type MOSFET (e.g. 32 in FIG. 1). There is also a P$^+$ high conductivity contact region 58, formed in a channel region 48, as in a conventional trench-type MOSFET.

Unlike a conventional trench-type MOSFET, a highly conductive silicide layer 60 wraps over and around mesa 41 formed by trenches 42 and 43. The silicide layer 60 contacts the mesa top, and contacts the trench walls for 0.3 to 0.4 µm from their top. The source electrode or front metal 56 can now make a large area contact to source regions 50, while the width of the mesas between trenches has been reduced. Thus, the mesa width can be reduced from about 1000 Å for a prior art device to only a few hundred Å, and assists in permitting a 0.55 µm pitch. In addition, as previously noted, the vertically protruding TEOS caps in a conventional trench-type MOSFET have been eliminated, which allows the entire top surfaces of source regions 50 to be contacted by silicide 60. In contrast, in a conventional trench-type MOSFET, only the portion of the top surface of source regions 22 beyond TEOS caps 32 serves as the source contact area between the source electrode 28 and source regions 22, (see FIG. 1).

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A trench-type MOSFET comprising
a plurality of spaced gate trenches, each gate trench including an insulated gate electrode, said plurality of gate trenches defining a plurality of mesas, each of said mesas being between a pair of opposing gate trenches;
a plurality of source regions of a first conductivity formed in each mesa, each source region having a first portion exposed at a sidewall of a gate trench, and a second portion exposed at a top surface of a mesa, said source regions being formed over a channel region of a second conductivity, said channel region being adjacent said gate trenches; and
a high conductivity contact region of said second conductivity in each mesa between a pair of source regions;
a silicide contact layer over each mesa and in contact with first and second portions of said pair of source regions and said high conductivity contact region therebetween;
a source contact comprised of metal formed over said silicide contact layer over each mesa, and extending inside each gate trench, wherein said source contact is insulated from said gate electrodes inside said gate trenches.

2. A trench-type MOSFET of claim 1, wherein said gate electrode is comprised of polysilicon.

3. A trench-type MOSFET of claim 1, wherein said gate insulation is comprised of silicon dioxide.

* * * * *